n(12) United States Patent
Pun et al.

(10) Patent No.: US 9,029,809 B2
(45) Date of Patent: May 12, 2015

(54) MOVABLE MICROCHAMBER SYSTEM WITH GAS CURTAIN

(71) Applicants: Digby Pun, San Jose, CA (US); Ali Shajii, Weston, MA (US); Andrew B. Cowe, Andover, MA (US); Raymond Ellis, Aptos, CA (US); James T. McWhirter, San Jose, CA (US)

(72) Inventors: Digby Pun, San Jose, CA (US); Ali Shajii, Weston, MA (US); Andrew B. Cowe, Andover, MA (US); Raymond Ellis, Aptos, CA (US); James T. McWhirter, San Jose, CA (US)

(73) Assignee: Ultratech, Inc., San Jose, CA (US)

( * ) Notice: Subject to any disclaimer, the term of this patent is extended or adjusted under 35 U.S.C. 154(b) by 327 days.

(21) Appl. No.: 13/690,132

(22) Filed: Nov. 30, 2012

(65) Prior Publication Data

US 2014/0151344 A1 Jun. 5, 2014

(51) Int. Cl.
*H01L 21/268* (2006.01)
*H01L 21/324* (2006.01)
*B23K 26/12* (2014.01)
*H01L 31/18* (2006.01)

(52) U.S. Cl.
CPC .......... *B23K 26/127* (2013.01); *H01L 31/1864* (2013.01); *H01L 31/18* (2013.01); *B23K 26/12* (2013.01); *H01L 21/268* (2013.01); *H01L 21/324* (2013.01)

(58) Field of Classification Search
CPC ........ B23K 26/00; B23K 26/08; B23K 26/12; B23K 26/14; H01L 31/1864; H01L 31/1868; H01L 31/1872; H01L 21/268; H01L 21/324; H01L 21/22; H01L 21/265

USPC ........ 29/25.01; 219/121.84, 121.86; 438/166, 438/487, 795; 118/715; 156/345.51–345.55
See application file for complete search history.

(56) References Cited

U.S. PATENT DOCUMENTS

| | | | |
|---|---|---|---|
| 4,435,445 A | 3/1984 | Allred et al. |
| 4,444,812 A | 4/1984 | Gutsche |
| 4,801,352 A | 1/1989 | Piwczyk |
| 5,891,251 A | 4/1999 | MacLeish |
| 5,965,048 A | 10/1999 | Powers |
| 5,997,588 A | 12/1999 | Goodwin et al. |

(Continued)

FOREIGN PATENT DOCUMENTS

| | | | |
|---|---|---|---|
| JP | 2002151420 | | 5/2002 |
| KR | 2007052045 A | * | 5/2007 |

OTHER PUBLICATIONS

Petric et al., "High resolution E-beam lithography with the VLS-1000 performance of the microseal vacuum interface," SPIE vol. 537, Electron-Beam, X-Ray, and Ion-Beam Techniques for Submicrometer Lithographies IV (Jun. 1985), pp. 17-24.

(Continued)

*Primary Examiner* — Samuel M Heinrich
(74) *Attorney, Agent, or Firm* — Opticus IP Law PLLC

(57) ABSTRACT

A movable microchamber system with a gas curtain is disclosed. The microchamber system has a top member with a light-access feature and a stage assembly that supports a substrate to be processed. The stage assembly is disposed relative to the top member to define a microchamber and a peripheral microchamber gap. An inert gas is flowed into the peripheral microchamber gap to form the gas curtain just outside of the microchamber. The gas curtain substantially prevents reactive gas in the ambient environment from entering the microchamber when the stage assembly moves relative to the top member.

40 Claims, 12 Drawing Sheets

(56) References Cited

U.S. PATENT DOCUMENTS

| | | | |
|---|---|---|---|
| 5,997,963 | A | 12/1999 | Davison et al. |
| 6,654,095 | B1 * | 11/2003 | Nishi ............................. 355/30 |
| 6,665,046 | B2 | 12/2003 | Nogawa et al. |
| 6,818,857 | B1 * | 11/2004 | Cho et al. ................. 219/121.64 |
| 6,899,764 | B2 | 5/2005 | Frijlink |
| 7,375,791 | B2 | 5/2008 | Vogel |
| 7,807,947 | B2 | 10/2010 | Partanen et al. |
| 8,053,332 | B2 * | 11/2011 | Noda ............................. 438/458 |
| 2004/0058293 | A1 * | 3/2004 | Nguyen et al. ................. 432/129 |
| 2005/0117138 | A1 * | 6/2005 | Aoki ............................... 355/67 |
| 2011/0303148 | A1 | 12/2011 | Xie et al. |

OTHER PUBLICATIONS

Taiwan Office Action from the Taiwan Patent Office dated Mar. 4, 2015, for Taiwan Patent Application No. 102143304, which is a counterpart application to the above-identified U.S. Application.

Singapore Written Opinion from Intellectual Property Office of Singapore dated Feb. 17, 2015 for Singapore Patent Application No. 201307644-3, which is a counterpart application to the above-identified U.S. Application.

Search Report from Intellectual Property Office of Singapore dated Jun. 17, 2014 for Singapore Patent Application No. 2013076443, which is a counterpart application to the above-identified U.S. Patent Application.

* cited by examiner

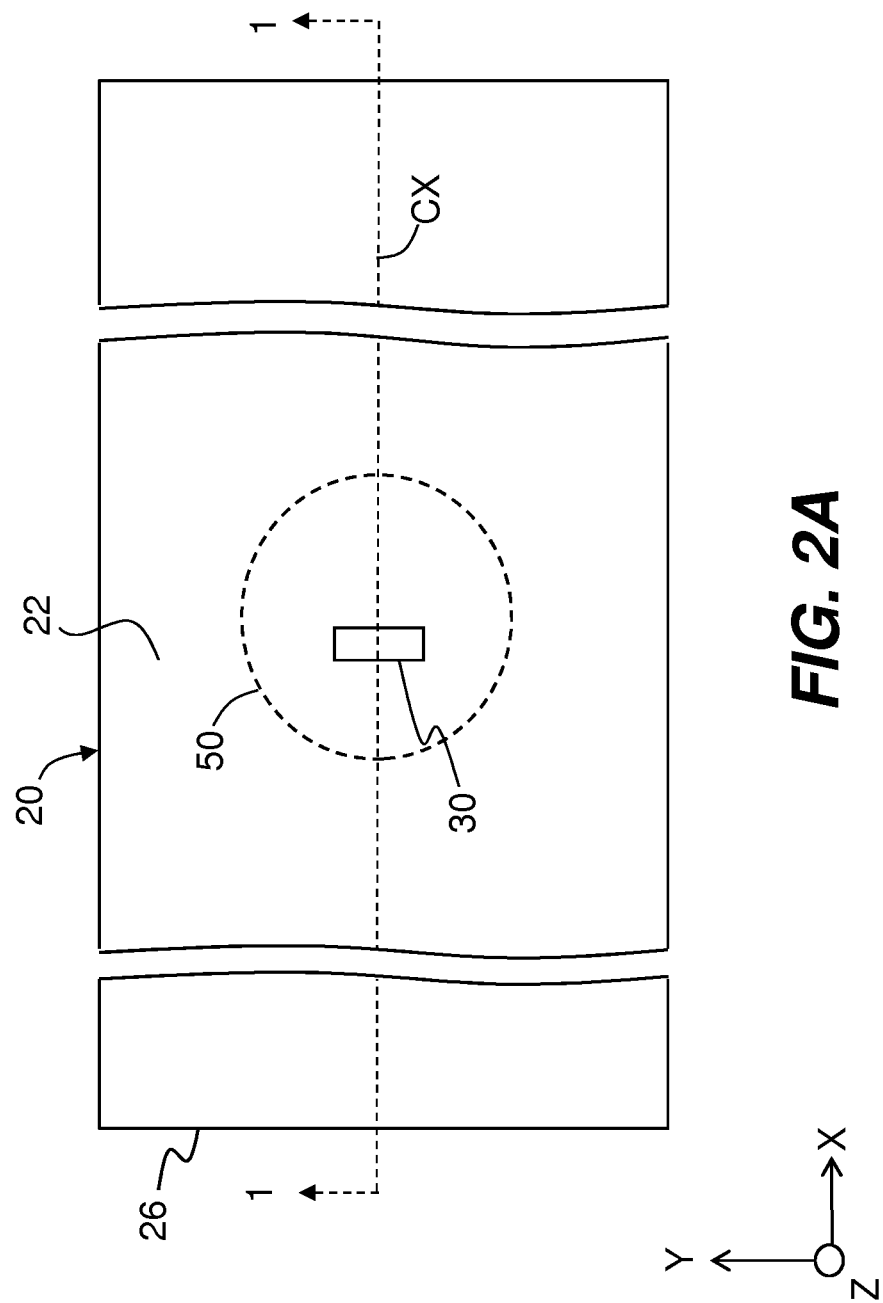

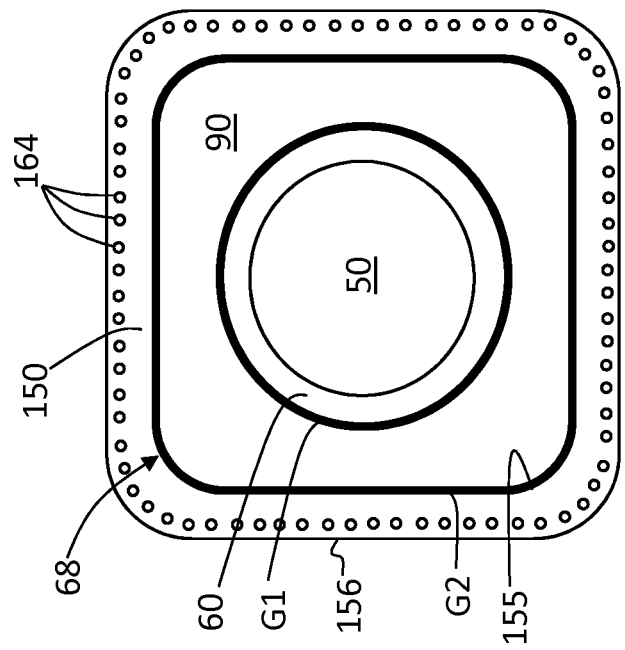
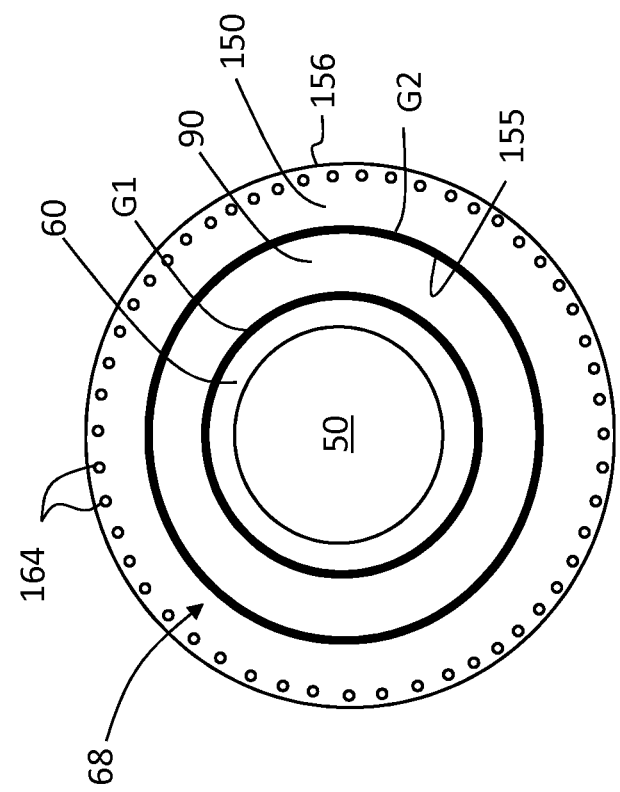

MOVABLE MICROCHAMBER SYSTEM WITH GAS CURTAIN

FIELD

The present disclosure relates to microchambers and in particular to a movable microchamber system with a gas curtain.

The entire disclosure of any publication or patent document mentioned herein is incorporated by reference.

BACKGROUND

Conventional process chamber systems used in semiconductor manufacturing are relatively large and stationary and need to be filled with far more reactant or gas than is actually necessary to carry out a particular process step on a wafer substrate. Further, some gas species are caustic while others are toxic, and therefore using minimal amounts of such gas is preferred.

To this end, a microchamber system has been developed as disclosed in U.S. Pat. No. 5,997,963. The microchamber system has a relatively small-volume chamber ("microchamber") that seals a process gas within the microchamber for processing.

While the microchamber system has proven useful for conventional semiconductor processes carried out at room temperature, the same microchamber system cannot be used effectively for high-temperature semiconductor process applications, such as laser annealing of wafers, which require elevating the substrate temperature to activate the annealing process. In particular, the thermal distortion associated with a high substrate temperature will cause the air bearing used in the microchamber system to fail.

SUMMARY

A movable microchamber system with a gas curtain is disclosed. The microchamber system has a top member with a light-access feature and a stage assembly that supports a substrate to be processed. The stage assembly is disposed relative to the top member to define a microchamber and a peripheral microchamber gap. The stage assembly has an outer periphery. An inert gas is flowed into the peripheral microchamber gap to form the gas curtain just outside of the microchamber, i.e., adjacent the outer periphery of the stage assembly. The gas curtain substantially prevents reactive gas in the ambient environment from entering the microchamber when the stage assembly moves relative to the top member.

An aspect of the disclosure is a microchamber system for processing a substrate without exposure to a reactive gas from an ambient environment. The system has a top member having at least one light-access feature. The system also has a stage assembly supporting the substrate. The stage assembly is disposed relative to the top member to define a microchamber and a peripheral microchamber gap. The stage assembly has an outer periphery and is movable relative to the top member. The microchamber contains a gas having either a select amount of the reactive gas or no substantial amount of the reactive gas. The system has at least one gas supply system that is pneumatically connected to the stage assembly. The stage assembly is configured to support the flow of the gas from the at least one gas supply system into the peripheral microchamber gap to form a gas curtain adjacent the outer periphery. The gas curtain substantially prevents the reactive gas of the ambient environment from entering the microchamber when the stage assembly moves relative to the top member.

Another aspect of the disclosure is a method of processing a substrate without exposing the substrate to a reactive gas present in an ambient environment outside of a microchamber. The method includes supporting the substrate on a movable stage assembly in the microchamber. The microchamber is defined by a stationary top member and the movable stage assembly. The moveable stage assembly has a ring member that defines, in combination with the top member, a peripheral microchamber gap. The stage assembly also has an outer periphery. The method further includes introducing a first gas into the microchamber, wherein the first gas has either no substantial amount of the reactive gas or has a select amount of the reactive gas. The method additionally includes introducing a second gas into a peripheral microchamber gap through the ring member to form a gas curtain adjacent the outer periphery of the stage assembly. The method also includes moving the movable stage relative to the stationary top member. The gas curtain prevents the reactive gas in the ambient environment from entering the microchamber during the moving of the movable stage.

Another aspect of the disclosure is a method of processing a substrate without exposing the substrate to a reactive gas present in an ambient environment outside of a microchamber. The method includes supporting the substrate on a movable stage assembly in the microchamber. The microchamber is defined by a stationary top member and the movable stage assembly. The moveable stage assembly has an outer periphery and a ring member that defines, in combination with the top member, a peripheral microchamber gap. The method further includes forming a vacuum in the microchamber. The method additionally includes introducing a gas into a peripheral microchamber gap through the ring member to form a gas curtain adjacent the outer periphery of the stage assembly. The gas used to form the gas curtain has either no substantial amount of the reactive gas or has a select amount of the reactive gas. The vacuum in the microchamber serves to draw a portion of the gas from the peripheral microchamber gap into the microchamber. The method also includes moving the movable stage relative to the stationary top member, wherein the gas curtain prevents the reactive gas in the ambient environment from entering the microchamber.

Additional features and advantages will be set forth in the Detailed Description that follows and in part will be readily apparent to those skilled in the art from the description or recognized by practicing the embodiments as described in the written description and claims thereof, as well as the appended drawings. It is to be understood that both the foregoing general description and the following Detailed Description are merely exemplary and are intended to provide an overview or framework for understanding the nature and character of the claims.

BRIEF DESCRIPTION OF THE DRAWINGS

The accompanying drawings are included to provide a further understanding and are incorporated in and constitute a part of this specification. The drawings illustrate one or more embodiment(s) and together with the Detailed Description serve to explain principles and operation of the various embodiments. As such, the disclosure will become more fully understood from the following Detailed Description, taken in conjunction with the accompanying Figures, in which:

FIG. 2A is a top-down view of the example microchamber of FIG. 1A, which has a light-access feature in the form of a single through opening in the top member;

FIGS. 4A and 4B are top-down views of example configurations of a chuck assembly and a ring member;

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute a part of this Detailed Description.

Cartesian coordinates are shown in some of the Figures for the sake of reference and are not intended to be limiting as to direction or orientation.

Figure 1A:
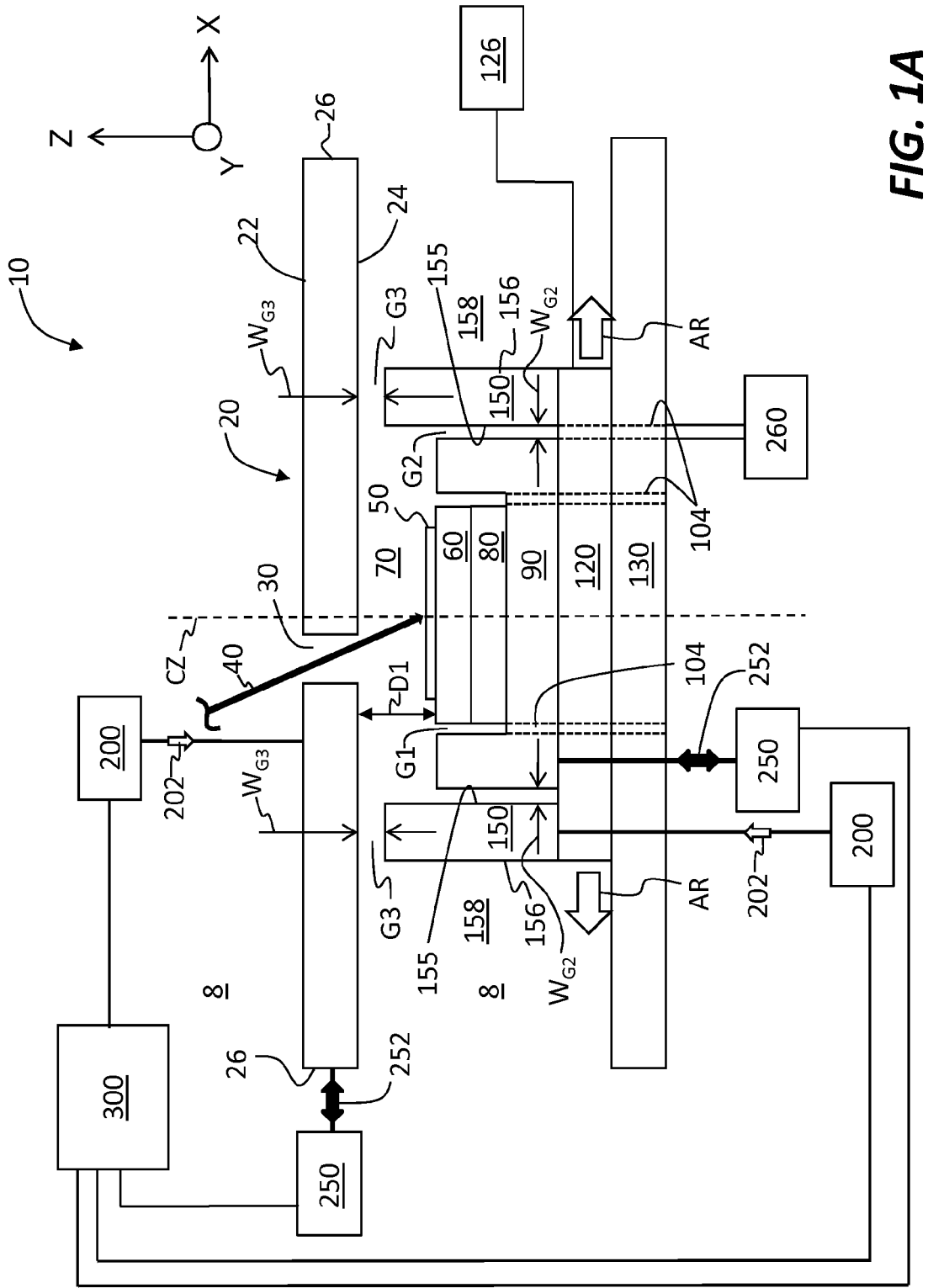
FIG. 1A is a schematic cross-sectional diagram (in the X-Z plane) of an example embodiment of a microchamber system as disclosed herein.
Figure 1B:
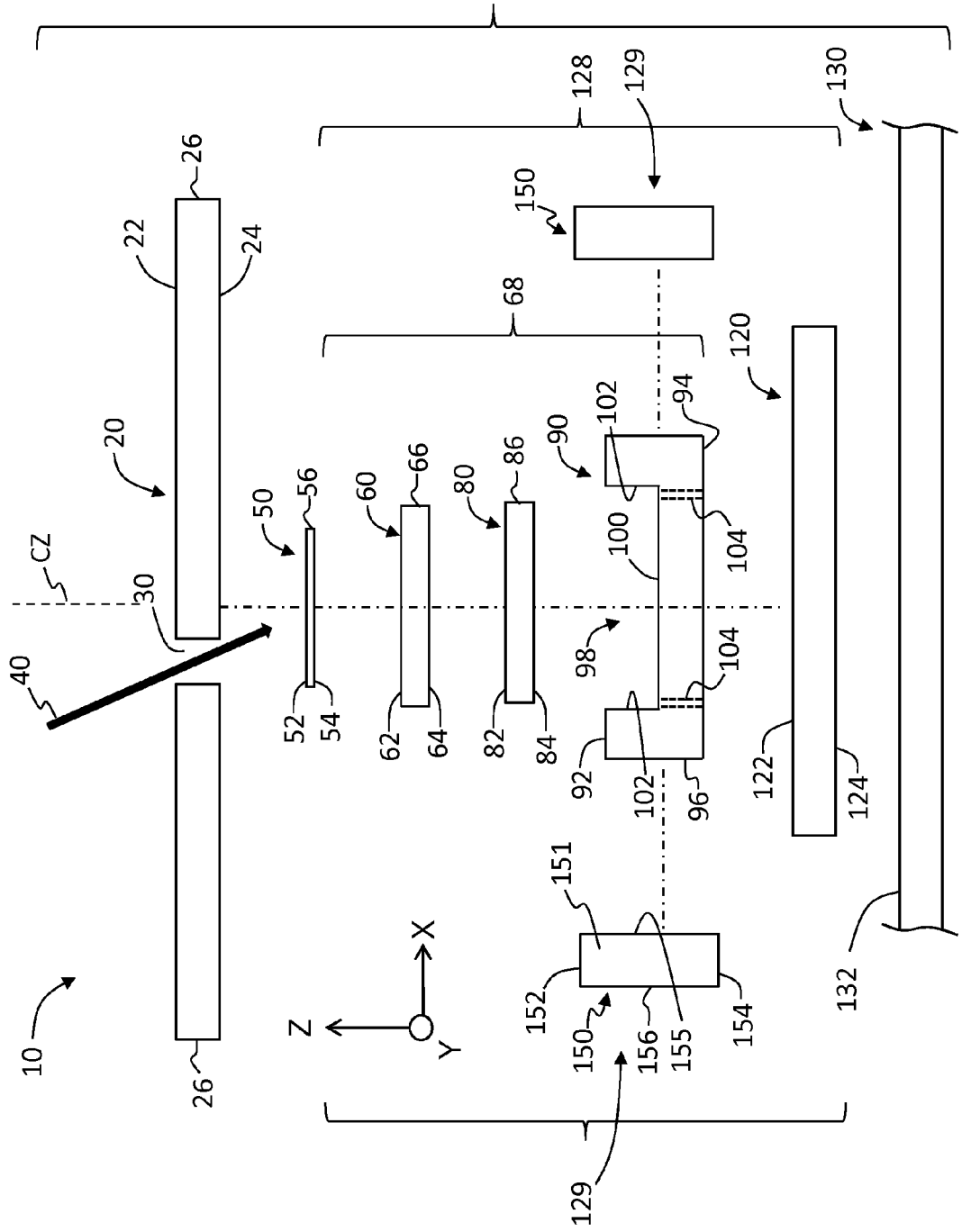
FIG. 1B is an exploded cross-sectional view of some of the main components of the microchamber of the microchamber system of FIG. 1A.

FIG. 1A is a schematic cross-sectional diagram (in the X-Z plane) of an example embodiment of a microchamber system ("system") 10. FIG. 1B is an exploded view of some of the main components of system 10 of FIG. 1. FIG. 2A is a top-down view of system 10 (in the X-Y plan) of FIG. 1A, with line 1-1 showing the cross-section taken for FIG. 1.

The system 10 has a Z-centerline CZ that runs in the Z-direction and an X-centerline CX that runs in the X-direction. The system 10 resides in an ambient environment 8 that may include at least one reactive gas, such as oxygen. It may also include non-reactive gasses, such as neon or argon, or stable gases, such as nitrogen.

The system 10 includes a top member 20 having an upper surface 22, a lower surface 24 and an outer edge 26. In an example, top member 20 is generally rectangular in shape and has parallel upper and lower surfaces 22 and 24. In an example, top member 20 is cooled, as described in greater detail below. In an example, top member 20 includes at least one light-access feature 30 that allows at least one laser beam 40 to pass through the top member. In an example, the at least one light-access feature 30 comprises one or more through openings, while in another example discussed below in connection with FIG. 7, the light-access feature can include at least one window.

The system 10 also includes a chuck 60 having an upper surface 62, a lower surface 64 and an outer edge 66. The chuck 60 is generally cylindrical in shape and is centered on Z-centerline CZ, with upper surface 62 adjacent and parallel to lower surface 24 of top member 20. The upper surface 62 of chuck 60 and lower surface 24 of top member 20 are spaced apart by a distance D1 in the range from 50 microns to 1 mm and thus define a chamber 70 with the height D1.

The chuck upper surface 62 is configured to support a semiconductor substrate ("substrate") 50 having an upper surface 52, a lower surface 54 and an outer edge 56. In an example, semiconductor substrate 50 is a silicon wafer. The semiconductor substrate 50 can be a product wafer that has undergone processing to create semiconductor devices and that is being further processed by laser beam 40. The substrate 50 is shown as a dashed-line circle in the top-down view of FIG. 2A. In an example, chuck 60 is heated and, in a further example, is configured to heat substrate 50 to a wafer temperature $T_w$ of up to about 400° C. In an example, the at least one laser beam 40 comprises one or more annealing laser beams, i.e., one or more laser beams that can perform an annealing process in substrate 50, such as, for example, dopant diffusion.

The system 10 also includes a thermal insulating layer 80 having an upper surface 82, a lower surface 84 and an outer edge 86. The thermal insulating layer 80 is arranged immediately adjacent chuck lower surface 64 so that the insulating layer is in thermal communication therewith. In examples, thermal insulating layer 80 is made of a glass or ceramic material, or is a gap. In an example, upper surface 82 of thermal insulating layer 80 is in intimate contact with lower surface 64 of chuck 60.

The system 10 also includes a cooling device 90 configured to thermally manage heat generated by chuck 60 and by virtue of laser beam 40 being incident upon substrate 50, as described below. An example cooling device 90 includes an upper surface 92, a lower surface 94 and an outer edge 96. The cooling device 90 includes a recess 98 that is defined by a support surface 100 and inner walls 102. The recess 98 is configured to accommodate thermal insulating layer 80 and chuck 60 so that that the thermal insulating layer is supported by support surface 100. In an example, inner walls 102 of cooling device 90 and outer edges 86 and 66 of thermal insulating layer 80 and chuck 60 define a gap G1. In a further example, cooling device 90 includes one or more gas-flow channels 104 that provide a gas flow path from support surface 100 to lower surface 94 so that a gas 202 in chamber 70 that enters gap G1 can flow out of the chamber through the cooling device at the lower surface. The thermal insulating layer 80 can also be an air gap.

The system 10 also includes a movable stage 120 having an upper surface 122 and a lower surface 124. The system 10 further includes a ring member 150 arranged adjacent cooling device outer edge 96. The ring member 150 has a body 151 and includes an upper surface 152, a lower surface 154, an inner surface 155 and an outer surface 156. The combination of chuck 60, thermal insulating layer 80 and cooling device 90 constitutes a chuck assembly 68. The combination of chuck assembly 68, movable stage 120 and ring member 150 constitute a movable stage assembly 128. The top member 20 is stationary relative to movable stage assembly 128. Movable stage assembly 128 has an outside perimeter 129, which in an example is defined in part by ring outer surface 156.

The movable stage 120 supports cooling device 90 on upper surface 122. The movable stage 120 is operably connected to a positioner 126 configured to cause the stage to move and to position the stage as needed while also tracking the stage position relative to a reference position. The movable stage 120 is operably supported on a platen 130 having an upper surface 132 in a manner that allows the stage to move in the X-Y plane.

The top member lower surface 24, ring member outer edge 156 and platen upper surface 132 define a gas curtain region 158.

In an example, movable stage 120 and chuck 60 are integrated to form either a unitary or a dual-component movable chuck that is operably connected to positioner 126. The top member 20 is sufficiently long in the X-direction for chuck 60 to move relative to the top member so that laser beams 40 can expose the entire substrate upper surface 52.

Figure 4C:
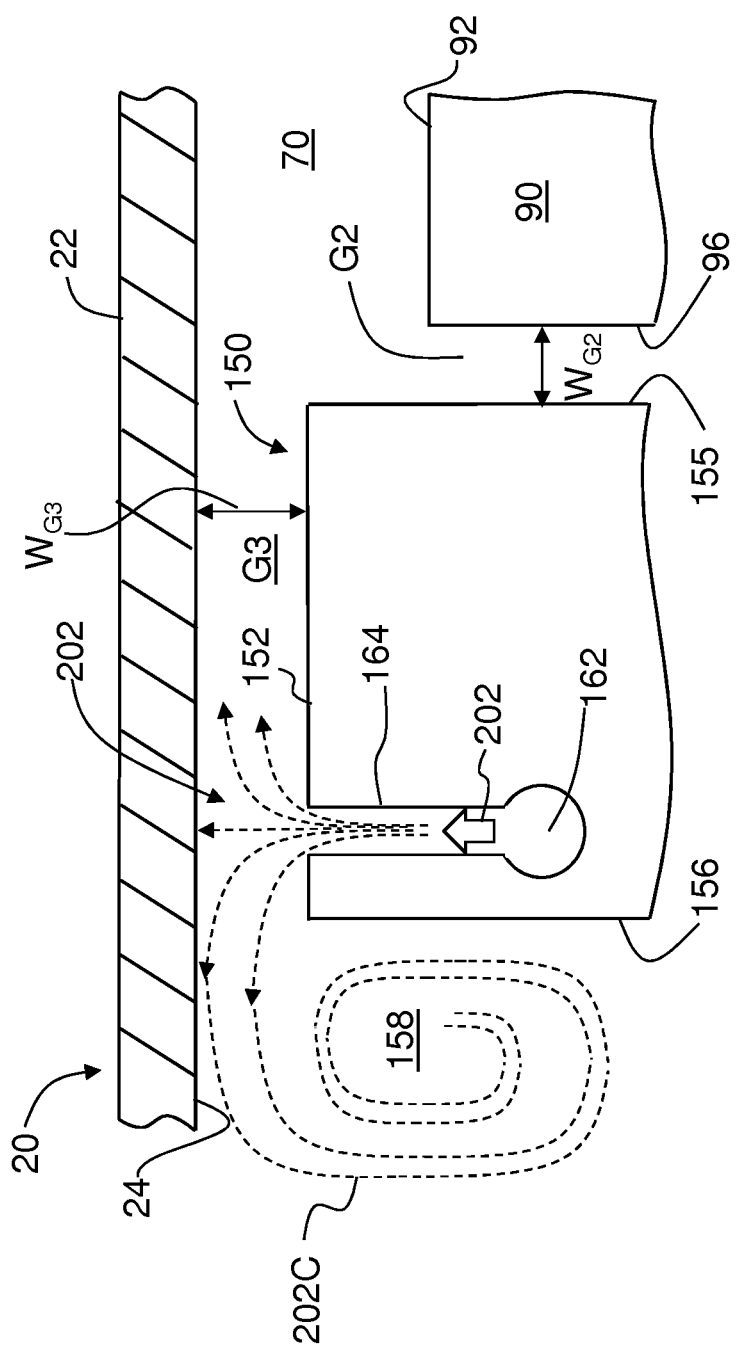
FIG. 4C is a close-up cross-sectional view of a portion of the microchamber showing the top-portion ring member along with an example channel and opening at the ring-member upper surface.

FIG. 4 is a top-down view of substrate 50, chuck 60 and ring member 150. The ring member 150 is arranged relative to cooling device 90 such that ring member inner surface 155 is adjacent cooling device outer edge 96 and defines an annular gap G2 therebetween. In an example, gap G2 is vented to the outside (i.e., to ambient environment 8). In an example, the width $W_{G2}$ of gap G2 is in the range from 0.5 mm to 2 mm. As best seen in FIG. 4C, ring member upper surface 152 and top member lower surface 24 define a peripheral microchamber gap G3 having a width $W_{G3}$. In an example, width $W_{G3}$ is in the range from 0.01 mm to 2 mm, while in another example is in the range from 0.1 mm to 1 mm. The peripheral microchamber gap G3 is so designated because the gap runs around the periphery of microchamber 70.

The system 10 also includes at least one gas supply system 200 and at least one coolant supply system 250. In an example, a first gas supply system 200 is configured to provide gas 202 to chamber 70, while another gas supply system 200 is configured to provide gas 202 to ring member 150. In one example embodiment, different gas supply systems 200 supply different gases 202, while in another example embodiment they supply the same gases.

In another embodiment, a single gas supply system 200 is employed to provide gas 202 to microchamber 70 and ring member 150. In an example, microchamber 70 contains gas 202 and substantially none of the reactive gas present in ambient environment 8. The phrase "substantially no reactive gas" as used here means that there is not enough reactive gas to have a substantial impact on the process being carried out in microchamber 70 on substrate 50. An example gas 202 can include one or more inert gases, such as neon, argon, helium and nitrogen. In an example, gas 202 consists of one or more inert gases. In another example, gas 202 includes at least one reactive gas, such as oxygen, in a select amount.

It is noted that having a select amount of a reactive gas such as oxygen in gas 202 still requires preventing the same reactive gas present in ambient environment 8 from entering chamber 70 so that the amount of the reactive gas within the chamber is not altered. In an example, the select amount of reactive gas in gas 202 reacts with at least one laser beam 40 to modify substrate 50.

Figure 5A:
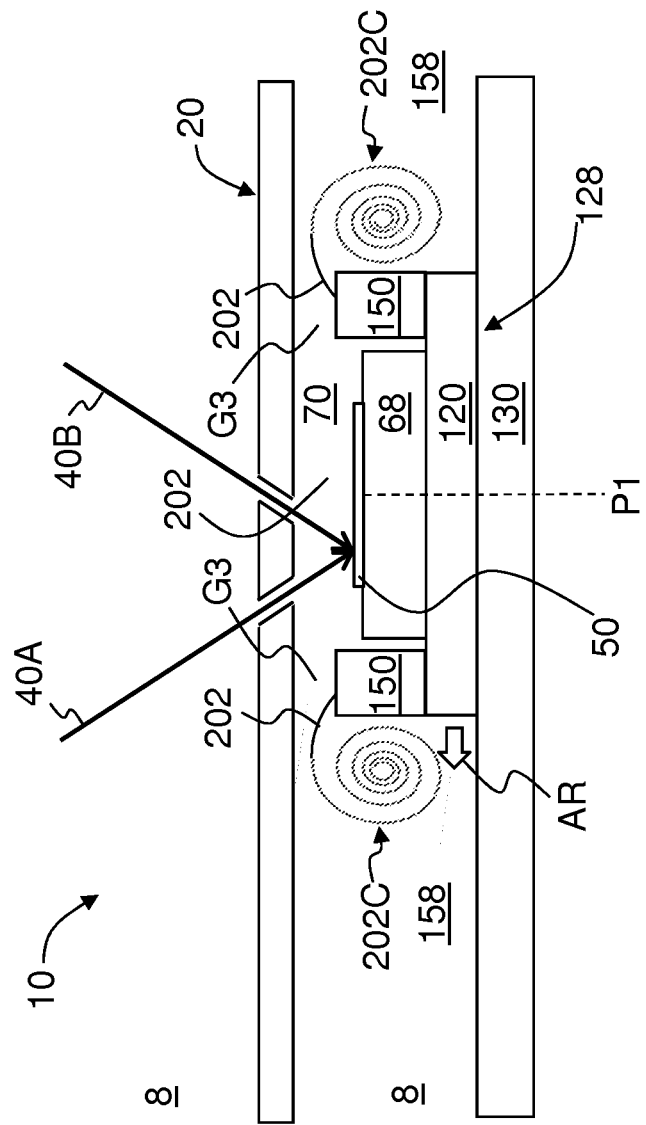
FIGS. 5A through 5C are schematic side views of the microchamber system of FIG. 3 showing the movement of a stage assembly relative to the top member, with the movement indicated by arrows AR.
Figure 5B:
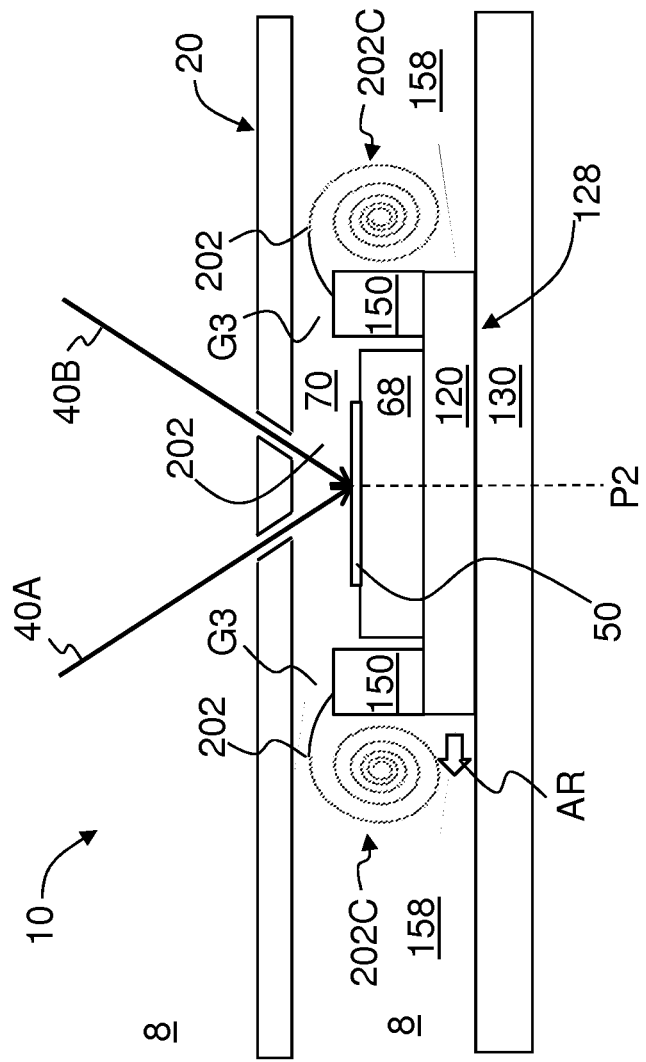
Figure 5C:
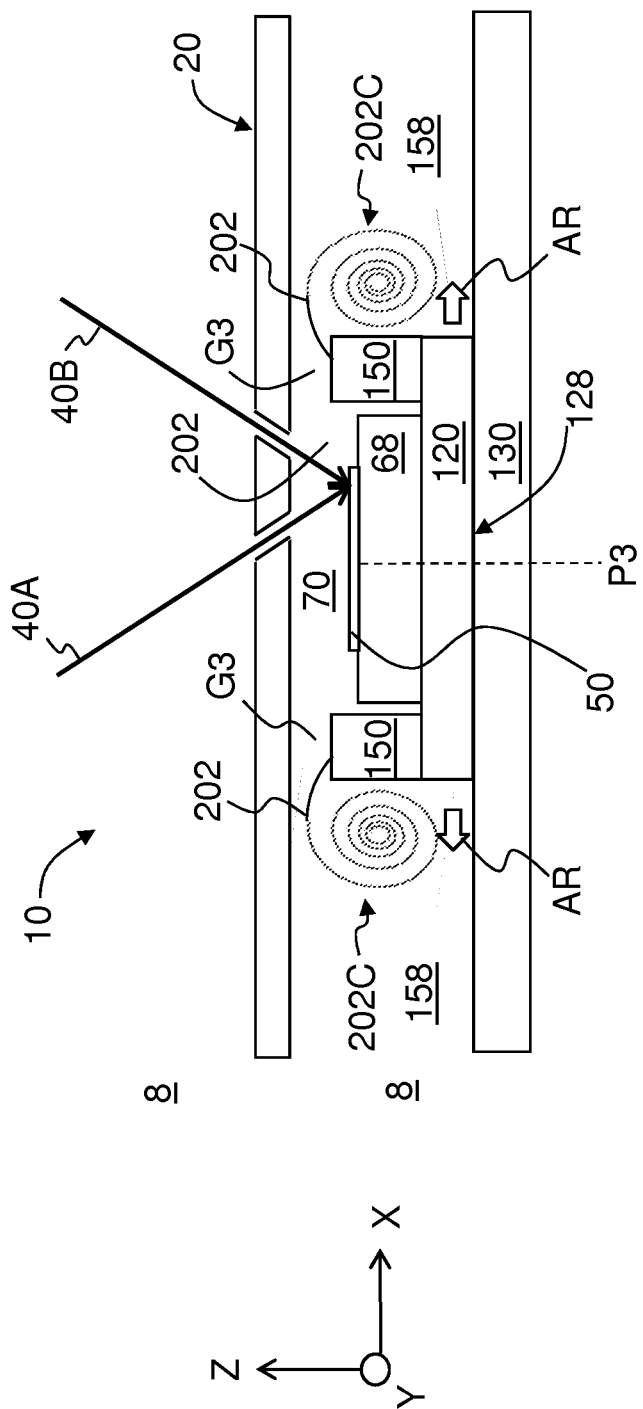

The ring member 150 is configured to control the flow of gas 202 into peripheral microchamber gap G3 to form a gas curtain 202C adjacent outer edge 156 of the ring member, as shown in FIGS. 5A through 5C and as described in greater detail below. Each coolant supply system 250 is configured to control the flow of a coolant 252, such as water or a water-glycerin mix.

The system 10 also includes a control unit 300 operably connected to gas supply system 200 and coolant supply system 250 and configured to control the operation of these systems to form the gas curtain 202C, as described below. The system 10 also includes a vacuum system 260 pneumatically connected to microchamber 70, e.g., via at least one channel 104. The vacuum system 260 can be used to form a vacuum in microchamber 70.

Figure 2B:
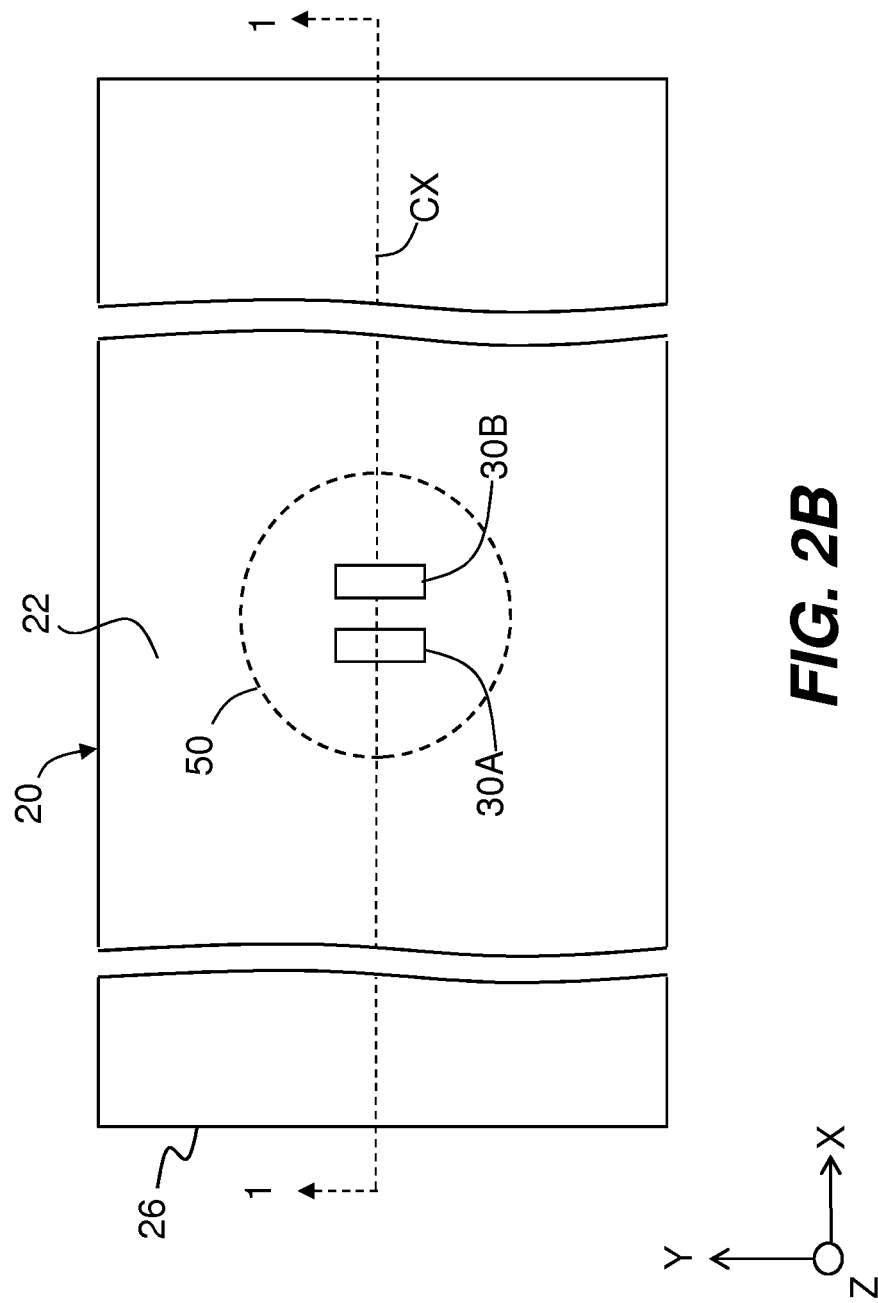
FIG. 2B is a top-down view of another example microchamber as shown in FIG. 1, wherein the top member includes a light-access feature in the form of two through openings.
Figure 3:
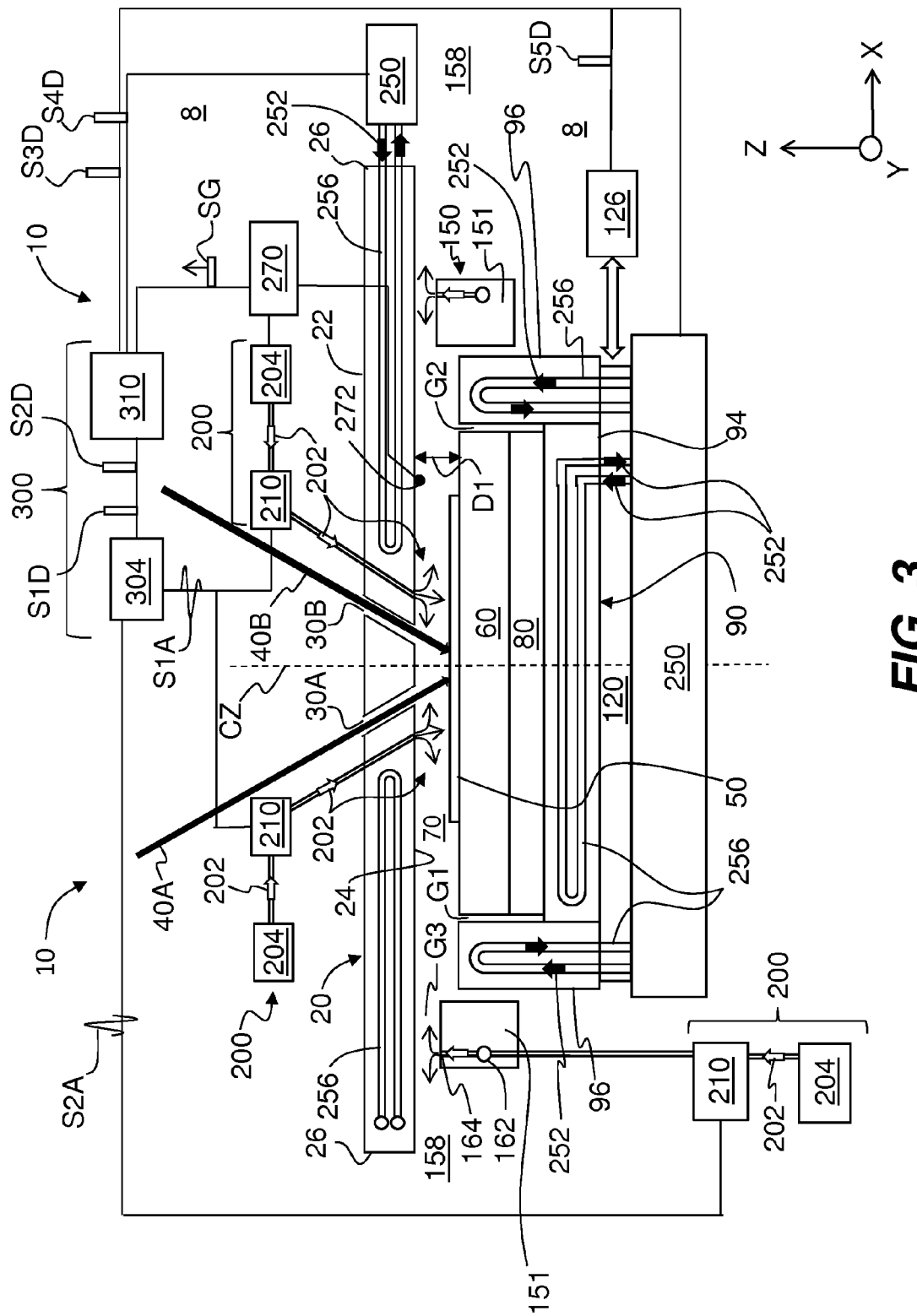
FIG. 3 is a detailed cross-sectional view of the microchamber system of FIG. 2B.

FIG. 3 is a more detailed schematic diagram of an example embodiment of system 10. The system 10 of FIG. 3 includes first and second light-access features in the form of through openings 30A and 30B in top member 20. FIG. 2B is similar to FIG. 2A and is a top-down view of system 10 of FIG. 3 showing first and second light-access features 30A and 30B. In an example, light-access features 30A and 30B are centered on X-centerline CX on either size of Z-centerline CZ.

In an example, first and second light-access features 30A and 30B have a rectangular cross-sectional shape and are angled inward from upper surface 22 to lower surface 24 in the X-Z plane. The first and second light-access features 30A and 30B are sized to pass first and second laser beams 40A and 40B through top member 20. In the case where first and second laser beams 40A and 40B are incident on top member 20 at an angle relative to Z-centerline CZ, the respective angles of light-access features 30A and 30B can be made to generally match the laser beam incident angles. It is noted here that light-access features 30A and 30B can be configured so that first and second laser beams 40A and 40B overlap at substrate 50.

The ring member 150 includes channels 162 within body 151 that are pneumatically connected to a plurality of openings 164 on upper surface 152. In an example, openings 164 are arranged near outer edge 156 of ring member 150. FIG. 4A is a top-down view of an example configuration of chuck assembly 68 with ring member 150 surrounding cooling device outer edge 96, wherein cooling device 90 and the ring member are circular. FIG. 4B is similar to FIG. 4A and shows another example configuration where cooling device 90 and ring member 150 have more rectangular (e.g., rounded square) shapes. In the examples of FIGS. 4A and 4B, openings 164 in ring member 150 are arranged closer to outer edge 156 than to inner surface 155.

FIG. 4C is a close-up cross-sectional view of a portion of system 10 showing the top portion of ring member 150 along with an example channel 162. The channel 162 runs around at least part of ring member 150. Also shown in FIG. 4C is one of multiple openings 164 that connects channel 162 to upper surface 152.

In an example configuration of ring member 150, there are between 5 and 50 openings per inch. An example size (diameter) of openings 164 is in the range from 0.02" to 0.05".

In an example embodiment, each gas supply system 200 includes a gas source 204 pneumatically connected to a flow control device 210. The flow control devices 210 are pneumatically connected to chamber 70, such as on opposite sides of light-access feature 30A and 30B, as shown by way of example in FIG. 3. In an example, first and second gas sources 204 are pressurized and supply gas 202, such as nitrogen, argon, helium, etc. In an example, flow control devices 210 are mass flow controllers or regulators.

In an example, two gas supply systems 200 are used to provide gas 202 to chamber 70, while a third gas supply system is pneumatically connected to ring member 150. In particular, third gas supply system 200 has a third gas source 204 pneumatically connected to a third flow control device 210, which in turn is pneumatically connected to output channel 162 of ring member 150. In an example, third gas source 204 is pressurized and supplies gas 202, which in an example is the same gas as supplied by the other gas supply systems.

In an example embodiment, system 10 also includes a gas sensor 270 that includes a gas sensor head 272 that resides within chamber 70. The gas sensor 270 is configured to detect the presence of a reactive gas (e.g., oxygen), which system 10 is designed to substantially prevent from entering chamber 70 from ambient environment 8.

In an example, control unit 300 includes a digital-to-analog (D/A) converter 304 electrically connected to a micro-processor controller ("microcontroller") 310. The D/A converter 304 is also electrically connected to the flow control devices 210 of system 10. The microcontroller 310 is also electrically connected to gas sensor 270 and receives a gas sensor signal SG representative of one or more gases 202 detected by the gas sensor.

In an example embodiment, top member 20 includes one or more coolant channels 256 fluidly connected to coolant supply system 250. The one or more coolant channels 256 are configured to circulate coolant 252 through top member 20 to cool the top member. The ring member 150 and cooling device 90 also include coolant channels 256 fluidly connected to their respective coolant supply systems 250 and that support the flow of coolant through the ring member and the cooling device.

In the operation of system 10, microcontroller 310 initiates the flow of gas 202 from the respective gas supply systems 200 into chamber 70 and into peripheral microchamber gap G3. This is accomplished in one example by microcontroller 310 sending a first digital control signal S1D to D/A converter 304, which converts the first digital control signal to a first analog control signal S1A. The first analog control signal S1A is provided to first and second flow control devices 210, which regulate the amount of gas 202 that flows from first and second gas supply systems 200 to chamber 70. This serves to fill chamber 70 with gas 202. The gas sensor 270 is used to confirm that the atmosphere within chamber 70 is constituted by gas 202 and does not include substantial amounts of unwanted reactive gases, such as oxygen.

Meanwhile, microcontroller 310 sends a second digital control signal S2D to D/A converter 304, which converts this control signal to a second analog control signal S2A. The second analog control signal S2A is provided to the third flow control device 210 that is pneumatically connected to ring member 150. This serves to regulate the amount of gas 202 that flows from the corresponding gas source 204 to channel 162 and out of openings 164 of ring member 150. The gas 202 that exits openings 164 flows into peripheral microchamber gap G3. Most of gas 202 that exits openings 164 and flows into peripheral microchamber gap G3 flows away from chamber 70 and spills into gas curtain region 158, thereby forming gas curtain 202C, as shown in FIGS. 5A through 5C.

It is noted here that the range of widths $W_{G3}$ for peripheral microchamber gap G3 is much greater than the width of an air-bearing gap for a conventional microchamber such as the one disclosed in the aforementioned U.S. Pat. No. 5,997,963, wherein the air-bearing-gap width is on the order of 5 microns or so. The air bearing of the '963 patent thus supports top member 20 in close proximity using a combination of countervailing forces provided by air pressure and by pulling a vacuum. Although the air-bearing gap offers an effective way to isolate the microchamber from the surrounding environment, its primary function is to provide a sliding gap via the use of pneumatic pressure. The air-bearing gap is formed by balancing between the force of the pneumatic pressure and the force of the vacuum pull. The gap is generally very small and can be reduced in size even further due to surface imperfections and pressure frustration.

The size (width) $W_{G3}$ of peripheral microchamber gap G3 is determined by the mechanical spacing of ring member 150 and top member 20. The size (width) $W_{G3}$ of gap G3 is much larger than an air-bearing gap, e.g., by a factor of about 100×. Also, gap G3 is substantially independent of flatness variations or surface imperfection of top member 20 because such flatness variations or imperfections are only a small fraction of the gap width $W_{G3}$.

Thus, an air bearing requires the pair of interfacing surfaces to be extremely flat and uniform to avoid the surfaces contacting and damaging each other. In instances where a microchamber with an air bearing is subjected to substantial amounts of heat and a strong temperature gradient, the interfacing surfaces of the air bearing can no longer maintain the required flatness due to thermal distortions.

Meanwhile, in an example embodiment, microcontroller 310 initiates the flow of coolant 252 in top member 20 and cooling device 90 by activating the two coolant supply systems 250 fluidly connected thereto. This activation is accomplished using third and fourth digitals S3D and S4D, which if necessary can also be made analog signals by sending them through D/A converter 304.

In an example embodiment, vacuum system 260 is used to create a vacuum in chamber 70, and gas 202 is flowed into peripheral microchamber gap G3. The vacuum created in chamber 70 serves to draw a portion of gas 202 into chamber 70, obviating the need for flowing the gas into chamber 70 from a different gas supply system 200.

Once the flow of gas 202 into chamber 70 and into peripheral microchamber gap G3 is established and the circulation of coolant 252 is established in top member 20 and cooling device 90, positioner 126 is activated by a control signal S5D to move stage 120. The laser beams 40A and 40B pass through the corresponding light-access features 30A and 30B and the laser beams scan over substrate surface 52 due to movement of substrate 50 relative to the laser beams. FIGS. 5A through 5C are schematic side views of system 10 showing the movement of stage assembly 128 relative to top member 20, with the movement indicated by arrows AR.

As stage assembly 128 and substrate 50 supported thereby on chuck 60 move back and forth relative to top member 20, gas 202 flows from openings 164 into peripheral microchamber gap G3 and then away from chamber 70. This flow of gas 202 becomes turbulent as it exits peripheral microchamber gap G3 and flows into gas curtain region 158 where the gas forms gas curtain 202C that blocks the ingress of any reactive gas or gases in ambient environment 8. Meanwhile, some of the gas 202 in chamber 70 flows into gaps G1 and G2, which lead to ambient environment 8, as illustrated schematically by one or more channels 104 shown as pneumatically connected to gap G2.

FIG. 5A shows stage assembly 128 at a position P1 and moving in the −X-direction, with laser beams 40A and 40B being incident near the left edge of surface 52 of substrate 50. FIG. 5B shows stage assembly 128 at a position P2 at about the middle of its scan still moving in the −X-direction, with laser beams 40A and 40B incident upon surface 52 of substrate 50 at about the middle of the substrate. FIG. 5C shows stage assembly 128 at a position P3 at the end of its scan, where the stage assembly decelerates, stops, and then accelerates to a maximum velocity $V_M$ as it moves in the opposite direction (i.e., the +X-direction). This process is also repeated at position in the opposite directions.

In an example, stage 120 is configured to move chuck 60 in the Y-direction so that laser beams 40A and 40B can scan a previously unscanned portion of substrate 50. The stage assembly 128 moves back and forth, accelerates and decelerates at the end positions P1 and P3, and reaches the aforementioned maximum velocity $V_M$ during a given scan.

Figure 6:
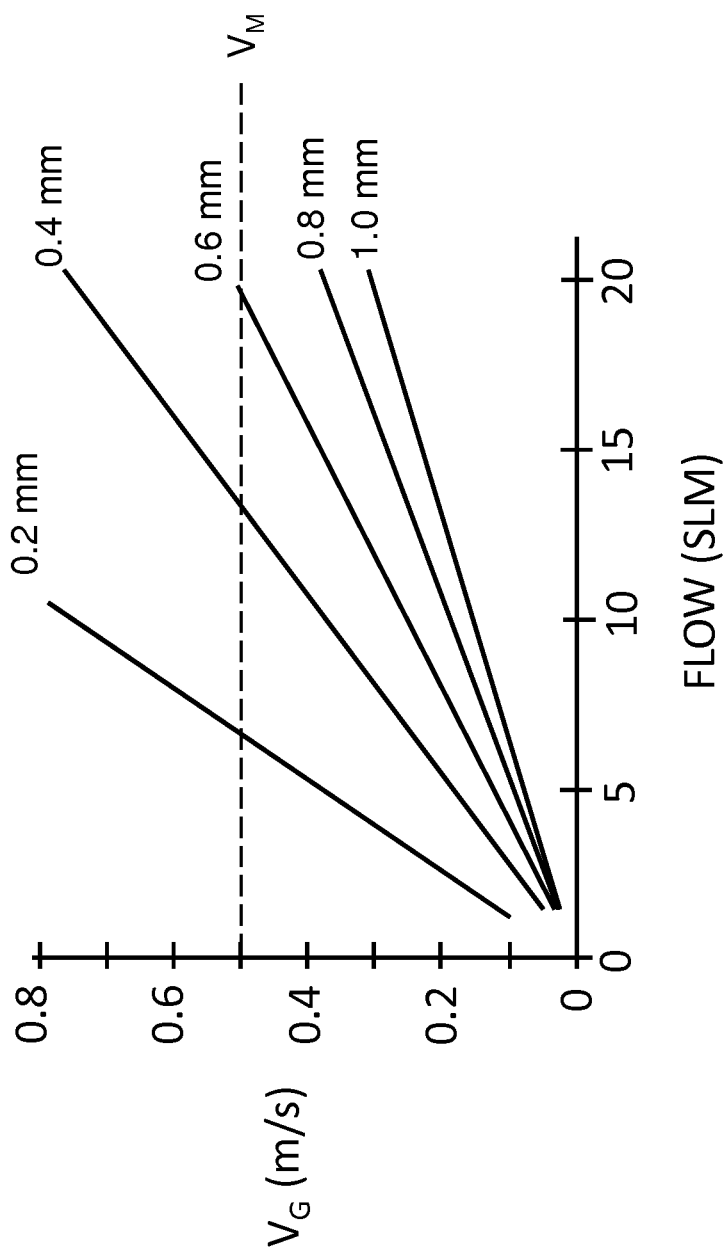
FIG. 6 is a plot of the gas velocity $V_G$ (m/s) versus gas flow rate (standard liters per minute or SLM) for different widths $W_{G3}$, namely, 0.2 mm, 0.4 mm, 0.6 mm, 0.8 mm and 1 mm, with an example maximum stage assembly velocity $V_M$ (m/s) indicated on the plot as a dashed line at 0.5 m/s.

The ability of system 10 to form gas curtain 202C, which serves to keep one or more reactive gases present in ambient environment 8 from entering chamber 70, is a function of the maximum velocity $V_M$ of stage assembly 128, the velocity $V_G$ of gas 202 that exits openings 164, and the width $W_{G3}$ of peripheral microchamber gap G3. FIG. 6 is a plot of the gas velocity $V_G$ (m/s) versus gas flow rate (standard liters per minute or SLM) for different widths $W_{G3}$, namely, 0.2 mm, 0.4 mm, 0.6 mm, 0.8 mm and 1 mm. The maximum stage assembly velocity $V_M$ (m/s) is indicated on the plot as a dashed line at 0.5 m/s.

To keep the one or more reactive gases present in ambient environment 8 from entering chamber 70, the gas velocity $V_G$ must be greater than the maximum velocity $V_M$ of stage assembly 128. The plot of FIG. 6 indicates that for a maximum velocity $V_M$ of 0.5 m/s, the width $W_{G3}$ of peripheral microchamber gap G3 cannot be greater than about 0.6 mm.

Since the mass of gas 202 is much less than that of the moving mechanism involved in system 10, inertia effects due to acceleration and deceleration are negligible, and no noticeable differences in the gas flow pattern were observed during the starting and stopping of system 10.

Figure 7:
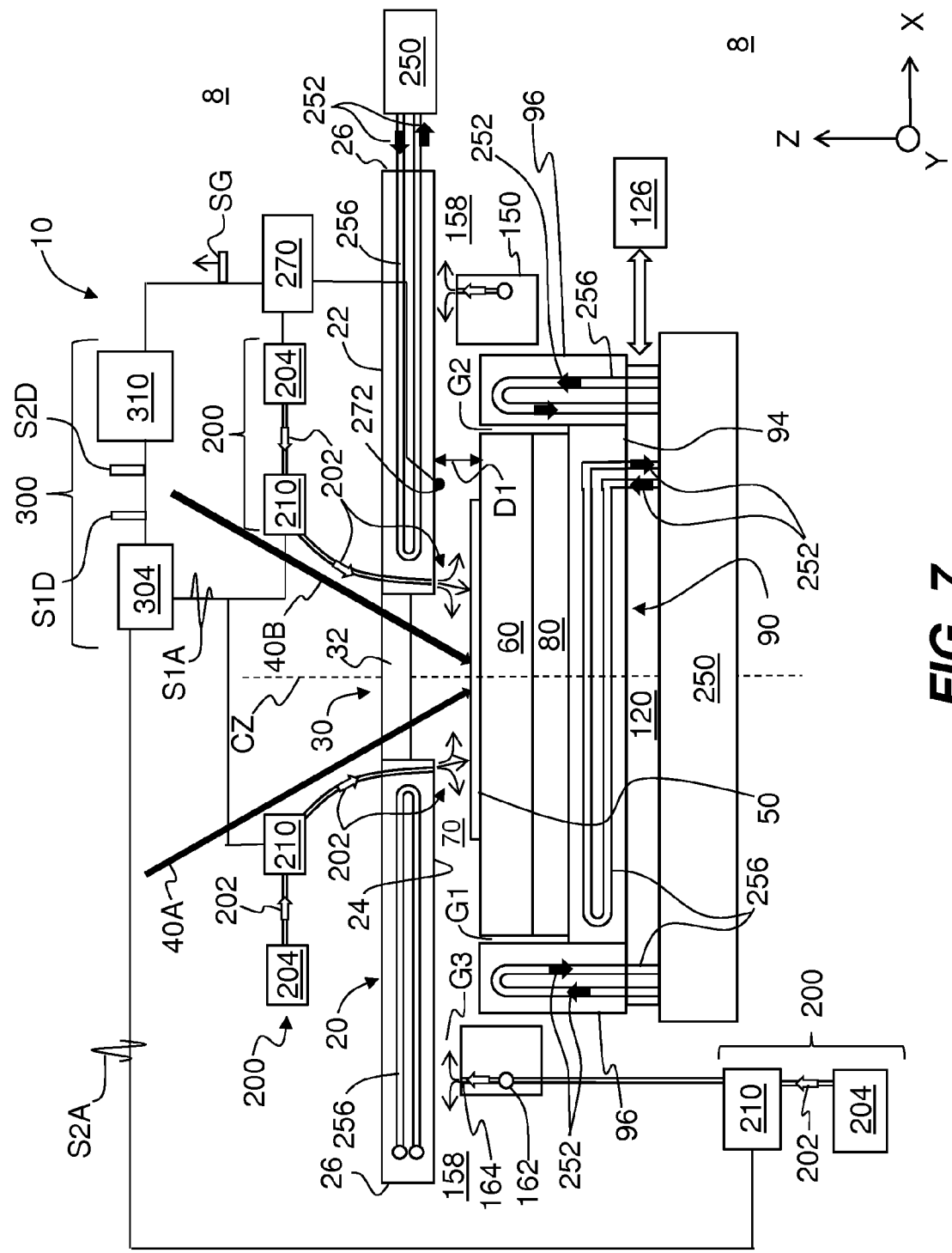
FIG. 7 is similar to FIG. 3 and shows an example embodiment of the microchamber system wherein the microchamber includes a light-access feature in the form of a window in the top member rather than one or more through openings.

FIG. 7 is a schematic diagram of system 10 similar to FIG. 3, except that instead of light-access features 30A and 30B being defined by first and second through openings, top member has a single opening that is sealed with a window 32. The window 32 is substantially transmissive at the wavelengths of light of laser beams 40A and 40B. In an example, window 32 is made of fused quartz. The cooling of top member 20 serves to cool window 32. In an example, top member 20 can include different types of light-access features 30, e.g., one through opening and one window 32.

This design of window 32 of system 10 in FIG. 7 is suitable for a low-laser-power application and has the benefit of reducing gas consumption while providing a higher degree of protection to substrate 50. It is also useful for applications where the gas 202 introduced into chamber 70 may be harmful to humans, window 32 serving to restrict the amount of gas that can escape from the chamber and into ambient environment 8.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A microchamber system for processing a substrate without exposure to a reactive gas from an ambient environment, comprising:
   a stationary top member having at least one light-access feature;
   a stage assembly supporting the substrate, the stage assembly having an outer periphery and being disposed relative to the stationary top member to define a microchamber and a peripheral microchamber gap and being movable relative to the stationary top member, wherein the microchamber contains a gas having either a select amount of the reactive gas or no substantial amount of the reactive gas; and
   at least one gas supply system pneumatically connected to the stage assembly, which is configured to support the flow of the gas from the at least one gas supply system into the peripheral microchamber gap to form a gas curtain adjacent the stage assembly outer periphery when the stage assembly moves relative to the stationary top member, wherein the gas curtain substantially prevents the reactive gas of the ambient environment from entering the microchamber.

2. The microchamber system of claim 1, wherein the at least one light-access feature includes at least one of a through opening and a window.

3. The microchamber system of claim 1, wherein the at least one light-access feature is configured to allow at least one laser beam to pass through the stationary top member and on to the substrate.

4. The microchamber system of claim 1, wherein the gas is one selected from the group of gases comprising: nitrogen, argon, helium and neon.

5. The microchamber system of claim 1, wherein the reactive gas is oxygen.

6. The microchamber system of claim 1, wherein the at least one gas supply system supplies the gas to the microchamber.

7. The microchamber system of claim 1, wherein the stage assembly includes a cooled chuck assembly.

8. The microchamber system of claim 7, wherein the stationary top member is cooled.

9. The microchamber system of claim 1, wherein the stage assembly includes a ring member that in part defines the microchamber peripheral gap and that includes an array of openings that support the flow of the gas from the at least one gas supply system into the microchamber peripheral gap.

10. The microchamber system of claim 1, wherein the peripheral gap has a width in the range from 0.01 mm to 2 mm.

11. The microchamber system of claim 10, wherein the peripheral gap has a width in the range from 0.1 mm to 1 mm.

12. The microchamber system of claim 1, wherein the stage assembly has a maximum velocity $V_M$ relative to the stationary top member, and wherein the gas entering the peripheral microchamber gap has a gas velocity $V_G$, wherein $V_G < V_M$.

13. A method of processing a substrate without exposing the substrate to a reactive gas present in an ambient environment outside of a microchamber, comprising:
   supporting the substrate on a movable stage assembly in the microchamber, wherein the microchamber is defined by a stationary top member and the movable stage assembly, the moveable stage assembly having an outer periphery and a ring member that defines, in combination with the stationary top member, a peripheral microchamber gap;
   introducing a first gas into the microchamber, wherein the first gas has either no substantial amount of the reactive gas or has a select amount of the reactive gas;
   introducing a second gas into a peripheral microchamber gap through the ring member and;
   moving the movable stage assembly relative to the stationary top member to cause the second gas to form a gas curtain adjacent the outer periphery of the stage assembly; and
   wherein the gas curtain substantially prevents the reactive gas in the ambient environment from entering the microchamber during the moving of the movable stage assembly.

14. The method of claim 13, wherein the first and second gases are the same gas.

15. The method of claim 13, further comprising processing the substrate with at least one laser beam that passes from the ambient environment into the microchamber via at least one light-access feature of the stationary top member.

16. The method of claim 15, wherein the at least one laser beam includes at least one annealing laser beam.

17. The method of claim 15, wherein the at least one laser beam reacts with the select amount of reactive gas in the microchamber to modify the substrate.

18. The method of claim 15, wherein the at least one light-access feature includes at least one of a through opening and a window.

19. The method of claim 13, wherein the stage assembly has a maximum velocity $V_M$ relative to the stationary top member, further providing the gas entering the peripheral microchamber gap with a gas velocity $V_G$ such that $V_G<V_M$.

20. The method of claim 13, wherein the peripheral microchamber gap has a width in the range from 0.01 mm to 2 mm.

21. The method of claim 20, wherein the peripheral microchamber gap has a width in the range from 0.1 mm to 1 mm.

22. The method of claim 13, wherein the first and second gases are at least one gas selected from the group of gases comprising: nitrogen, argon, helium and neon.

23. The method of claim 13, wherein the stage assembly includes a heated chuck, further comprising heating the substrate using the heated chuck.

24. The method of claim 13, further comprising cooling the stage assembly and the stationary top member.

25. A method of processing a substrate without exposing the substrate to a first gas present in an ambient environment, comprising:
   supporting the substrate on a movable stage assembly in a microchamber, wherein the microchamber is defined by a stationary top member and the movable stage assembly, the moveable stage assembly having an outer periphery and a ring member that defines, in combination with the stationary top member, a peripheral microchamber gap;
   forming a vacuum in the microchamber;
   introducing a second gas into the peripheral microchamber gap through the ring member;
introducing a third gas into the microchamber, wherein the third gas includes at least one reactive gas;
   moving the movable stage relative to the stationary top member to cause the second gas to form a gas curtain adjacent the outer periphery, wherein the gas curtain substantially prevents the first gas in the ambient environment from entering the microchamber; and
   passing a first laser beam through a light-access feature in the stationary top member and into the microchamber to irradiate the substrate and the at least reactive gas of the third gas in the microchamber to modify the substrate.

26. The method of claim 25, wherein the at least one third reactive gas includes oxygen.

27. The method of claim 25, wherein the first gas includes oxygen and the least one third reactive gas includes oxygen.

28. The method of claim 25, wherein the second gas consists of one or more of nitrogen, argon, helium and neon.

29. The method of claim 25, wherein the peripheral microchamber gap has a width in the range from 0.01 mm to 2 mm.

30. The method of claim 25, wherein the peripheral microchamber gap has a width in the range from 0.1 mm to 1 mm.

31. The method of claim 25, further comprising passing a second laser beam through either the light-access feature or another light-access feature in the stationary top member and into the microchamber to irradiate the substrate and the at least one third reactive gas in the microchamber so that the second laser beam reacts with the at least one third reactive gas in the microchamber to modify the substrate.

32. A method of processing a substrate in a microchamber without altering a select amount of a reactive first gas present in microchamber, wherein the microchamber resides in an ambient environment that includes the reactive first gas, comprising:
   supporting the substrate on a movable stage assembly in the microchamber, wherein the microchamber is defined by a stationary top member and the movable stage assembly, the moveable stage assembly having an outer periphery and a ring member that defines, in combination with the stationary top member, a peripheral microchamber gap;
   introducing the select amount of the reactive first gas into the microchamber;
   introducing a second gas into a peripheral microchamber gap through the ring member;
   moving the movable stage relative to the stationary top member, thereby causing the second gas to form a gas curtain adjacent the outer periphery of the stage assembly, wherein the gas curtain substantially prevents the reactive first gas in the ambient environment from entering the microchamber and changing the select amount of the reactive first gas introduced into the microchamber.

33. The method of claim 32, wherein the first reactive gas comprises oxygen.

34. The method of claim 32, wherein the first reactive gas consists of oxygen.

35. The method of claim 32, wherein the second gas comprises at least one inert gas.

36. The method of claim 32, wherein the second gas consists of one or more inert gases.

37. The method of claim 32, wherein the peripheral microchamber gap has a width in the range from 0.01 mm to 2 mm.

38. The method of claim 32, wherein the peripheral microchamber gap has a width in the range from 0.1 mm to 1 mm.

39. The method of claim 32, further comprising directing at least one laser beam into the microchamber through at least one light-access feature in the stationary top member to irradiate the substrate and the at least one reactive first gas in the microchamber to modify the substrate.

40. The method of claim 32, wherein the movable stage assembly has a maximum velocity $V_M$ relative to the stationary top member, and wherein introducing the second gas into the peripheral microchamber gap includes providing the second gas with a gas velocity $V_G$ such that $V_G<V_M$.

* * * * *

UNITED STATES PATENT AND TRADEMARK OFFICE
CERTIFICATE OF CORRECTION

PATENT NO. : 9,029,809 B2
APPLICATION NO. : 13/690132
DATED : May 12, 2015
INVENTOR(S) : Pun et al.

It is certified that error appears in the above-identified patent and that said Letters Patent is hereby corrected as shown below:

In the Claims

Column 10, 11 and 12, lines 42, 16 and 56 In claims 12, 19 and 40, replace $V_G < V_M$ with: $V_G > V_M$.

Signed and Sealed this
Thirteenth Day of October, 2015

Michelle K. Lee
*Director of the United States Patent and Trademark Office*